US012581989B2

(12) United States Patent
Cha et al.

(10) Patent No.: US 12,581,989 B2
(45) Date of Patent: Mar. 17, 2026

(54) SEMICONDUCTOR DEVICE AND METHOD OF FABRICATING THE SAME

(71) Applicant: Samsung Electronics Co., Ltd., Suwon-si (KR)

(72) Inventors: Sangho Cha, Suwon-si (KR); Wonjung Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 544 days.

(21) Appl. No.: 17/984,446

(22) Filed: Nov. 10, 2022

(65) Prior Publication Data

US 2023/0326893 A1     Oct. 12, 2023

(30) Foreign Application Priority Data

Apr. 7, 2022     (KR) ......................... 10-2022-0043572

(51) Int. Cl.
| | |
|---|---|
| H01L 23/00 | (2006.01) |
| H01L 21/56 | (2006.01) |
| H01L 23/31 | (2006.01) |
| H01L 23/48 | (2006.01) |
| H01L 23/498 | (2006.01) |

(52) U.S. Cl.
CPC ............ H01L 24/13 (2013.01); H01L 21/568 (2013.01); H01L 23/3128 (2013.01); H01L 23/481 (2013.01); H01L 23/49822 (2013.01); H01L 24/05 (2013.01); H01L 2224/02205 (2013.01); H01L 2224/02215 (2013.01); H01L 2224/0401 (2013.01); H01L 2224/05624 (2013.01); H01L 2224/13007 (2013.01); H01L 2224/13082 (2013.01); H01L 2224/13111

(2013.01); *H01L 2224/13116* (2013.01); *H01L 2224/13118* (2013.01); *H01L 2224/13139* (2013.01);

(Continued)

(58) Field of Classification Search
CPC ......... H01L 24/13; H01L 24/05; H01L 24/24; H01L 24/16; H01L 24/11; H01L 24/07; H01L 21/568; H01L 21/6835; H01L 21/565; H01L 23/3128; H01L 23/481; H01L 23/49822; H01L 23/5389; H01L 23/49816; H01L 23/3114; H01L 23/3171
See application file for complete search history.

(56) References Cited

U.S. PATENT DOCUMENTS

| | | | | | |
|---|---|---|---|---|---|
| 5,943,597 | A | * | 8/1999 | Kleffner | H01L 24/13 257/737 |
| 8,436,467 | B2 | * | 5/2013 | Morifuji | H01L 24/11 257/737 |

(Continued)

FOREIGN PATENT DOCUMENTS

| | | |
|---|---|---|
| KR | 100553562 B1 | 2/2006 |
| KR | 1020170058680 A | 5/2017 |
| KR | 1020200005057 A | 1/2020 |

*Primary Examiner* — Dao H Nguyen
(74) *Attorney, Agent, or Firm* — Muir Patent Law, PLLC

(57) ABSTRACT

Disclosed are semiconductor devices and their fabrication methods. The semiconductor device comprises a pad on a semiconductor chip, a protective layer on the semiconductor chip and having an opening that exposes a portion of a top surface of the pad, and a bump structure electrically connected to the pad. The bump structure includes a metal layer on the pad and a solder ball on the metal layer. A first width of the metal layer is about 0.85 times to about 0.95 times a second width of the opening.

19 Claims, 16 Drawing Sheets

(52) U.S. Cl.
  CPC ............... *H01L 2224/13147* (2013.01); *H01L 2224/13155* (2013.01)

(56) References Cited

U.S. PATENT DOCUMENTS

| | | | |
|---|---|---|---|
| 9,023,716 B2 | 5/2015 | Lee et al. | |
| 9,564,376 B2 | 2/2017 | Tsao et al. | |
| 9,793,231 B2 | 10/2017 | Chen et al. | |
| 10,332,756 B2 | 6/2019 | Moriyama et al. | |
| 10,964,659 B2 | 3/2021 | Chen et al. | |
| 11,600,590 B2 * | 3/2023 | Liu | H01L 24/09 |
| 2013/0069231 A1 * | 3/2013 | Shen | H01L 24/13 |
| | | | 257/738 |
| 2013/0249082 A1 * | 9/2013 | Chien | H01L 24/13 |
| | | | 257/737 |
| 2016/0148888 A1 * | 5/2016 | Ryu | H01L 24/05 |
| | | | 257/737 |
| 2018/0294239 A1 * | 10/2018 | Sakata | H01L 23/49816 |
| 2019/0139921 A1 | 5/2019 | Baek et al. | |
| 2019/0206841 A1 * | 7/2019 | Kim | H01L 23/293 |
| 2020/0006274 A1 * | 1/2020 | Chiang | H01L 24/20 |
| 2021/0305114 A1 * | 9/2021 | Lee | H01L 25/03 |
| 2022/0045036 A1 * | 2/2022 | Shih | H01L 23/49816 |

* cited by examiner

SEMICONDUCTOR DEVICE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2022-0043572, filed on Apr. 7, 2022, in the Korean Intellectual Property Office, the disclosure of which is hereby incorporated by reference in its entirety.

BACKGROUND

The present inventive concepts relate to a semiconductor device and a method of fabricating the same, and more particularly, to a semiconductor device including a bump structure and a method of fabricating the same.

A semiconductor device generally has an electrical connection structure, such as solder ball or bump, for electrical connection with another semiconductor device or with a printed circuit board. Accordingly, it is required that the semiconductor device have an electrical connection structure capable of accomplishing stable electrical connection.

Semiconductor devices have been rapidly developed to increase the number of electrode terminals and to decrease a pitch between the electrode terminals. Therefore, there is an increase in research on compactness of semiconductor devices. A semiconductor device generally has an electrical connection structure, such as solder ball or bump, for electrical connection with another semiconductor device or with a printed circuit board. It is required that connection terminals of a semiconductor device have high reliability.

SUMMARY

Some embodiments of the present inventive concepts provide a semiconductor device whose structural stability is increased and a method of fabricating the same.

Some embodiments of the present inventive concepts provide a semiconductor fabrication method with less occurrence of failure and a semiconductor device fabricated by the same.

According to some embodiments of the present inventive concepts, a semiconductor device may comprise: a pad on a semiconductor chip; a protective layer on the semiconductor chip and covering the pad, the protective layer having an opening that exposes a portion of a top surface of the pad; and a bump structure electrically connected to the pad. The bump structure may include: a metal layer on the pad; and a solder ball on the metal layer. A first width of the metal layer may be about 0.85 times to about 0.95 times a second width of the opening.

According to some embodiments of the present inventive concepts, a semiconductor device may comprise: a substrate; a semiconductor chip on the substrate; a molding layer on the substrate and surrounding the semiconductor chip; and a redistribution layer on the molding layer and the semiconductor chip. The redistribution layer may include: a dielectric pattern; a conductive pattern on the dielectric pattern; a pad on the dielectric pattern and connected to the conductive pattern; a bump structure connected to the pad; and a protective layer on the dielectric pattern and surrounding the bump structure. The bump structure may be in an opening formed in the protective layer. A first width of the bump structure may be about 0.85 times to about 0.95 times a second width of the opening.

According to some embodiments of the present inventive concepts, a method of fabricating a semiconductor device may comprise: forming a molding layer that covers a semiconductor chip; forming a redistribution layer on the molding layer, wherein the redistribution layer includes a dielectric pattern, a conductive pattern on the dielectric pattern, a pad on the dielectric pattern and connected to the conductive pattern, and a protective layer having an opening that covers the pad and exposes a portion of the pad; providing a bump structure on the pad; using an adhesive layer to attach a carrier substrate to the redistribution layer; and removing the carrier substrate. A first width of the bump structure may be about $25/29$ times to about $11/12$ times a second width of the opening. After the carrier substrate is removed, the adhesive layer may not remain in a space between the bump structure and an inner sidewall of the opening.

BRIEF DESCRIPTION OF THE DRAWINGS

FIG. 11 illustrates a cross-sectional view showing a semiconductor device, according to some example embodiments of the present inventive concepts.

FIG. 12 illustrates a cross-sectional view showing a semiconductor device, according to some example embodiments of the present inventive concepts.

DETAIL DESCRIPTION

The following will now describe a semiconductor device according to the present inventive concepts with reference to accompanying drawings. Like numbers refer to like elements throughout. As used herein, terms such as "same," "equal," "planar," or "coplanar," when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Figure 1:
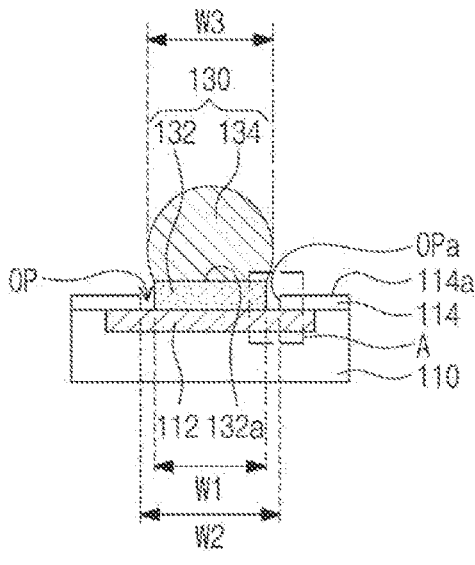
FIG. 1 illustrates a cross-sectional view showing a semiconductor device, according to some example embodiments of the present inventive concepts.
Figure 2:
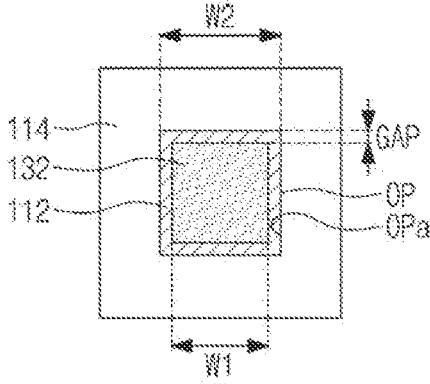
FIGS. 2 and 3 illustrate plan views showing a semiconductor device, according to some example embodiments of the present inventive concepts.
Figure 3:
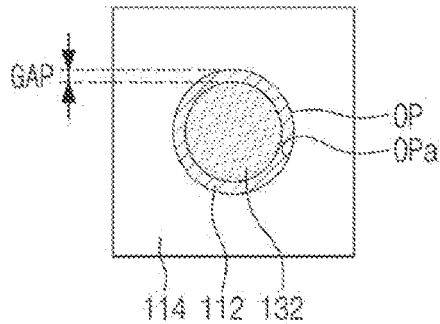
Figure 4:
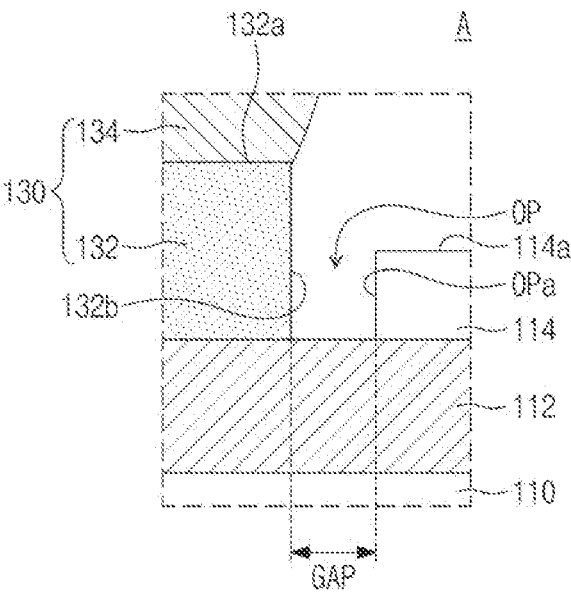
FIGS. 4 to 7 illustrate enlarged views showing section A of FIG. 1.

FIG. 1 illustrates a cross-sectional view showing a semiconductor device according to some example embodiments of the present inventive concepts. FIGS. 2 and 3 illustrate top plan views showing a semiconductor device according to some example embodiments of the present inventive concepts. FIG. 4 illustrates an enlarged view showing section A of FIG. 1.

Referring to FIGS. 1 to 4, a semiconductor device may include an electrical bump structure 130 provided on a substrate 110.

The substrate 110 may include a semiconductor substrate. For example, the substrate 110 may be a semiconductor substrate such as a semiconductor wafer. The substrate 110 may be a bulk silicon substrate, a silicon-on-insulator (SOI) substrate, a germanium substrate, a germanium-on-insulator (GOI) substrate, a silicon-germanium substrate, or an epitaxial layer substrate obtained by performing a selective epitaxial growth (SEG). The substrate 110 may include, for example, silicon (Si), germanium (Ge), silicon germanium (SiGe), gallium arsenic (GaAs), indium gallium arsenic (InGaAs), aluminum gallium arsenic (AlGaAs), or a mixture thereof. Alternatively, the substrate 110 may be a dielectric substrate.

The substrate 110 may include a circuit pattern provided therein. The circuit pattern may be a memory circuit, a logic circuit, or a combination thereof, any of which circuits includes one or more transistors. Alternatively, the circuit pattern may include a passive element, such as a resistor or a capacitor. The present inventive concepts, however, are not limited thereto, and the substrate 110 may not include the circuit pattern.

The substrate 110 may include a pad 112 provided on one surface of the substrate 110 and a protective layer 114 having a pattern that exposes the pad 112.

The pad 112 may be electrically connected to the circuit pattern provided in the substrate 110. For example, a memory circuit, a logic circuit, or a combination thereof formed in the substrate 110 is connected through the pad 112 to an external apparatus or another semiconductor device. For another example, the pad 112 may be connected to a wiring pattern provided in the substrate 110. The phrase "electrically connected/coupled" may include "directly connected/coupled" or "indirectly connected/coupled through other conductive component(s)." The pad 112 may include metal. For example, the pad 112 may include aluminum (Al).

The protective layer 114 may cover the pad 112 on the substrate 110. In example embodiments, a bottom surface of the protective layer 114 may contact an upper surface of the pad 112. The protective layer 114 may include a dielectric material. For example, the protective layer 114 may include a photosensitive polyimide (PSPI). For another example, the protective layer 114 may include one or more of silicon oxide (SiO), silicon nitride (SiN), and silicon oxynitride (SiON).

The protective layer 114 may have an opening OP that vertically penetrates the protective layer 114. The opening OP may expose at least a portion of a top surface of the pad 112. When viewed in a plan view, the opening OP may be positioned within the pad 112. For example, when viewed in plan view, an area of the pad 112 may be equal to or greater than an area of the opening OP, and the pad 112 may be centered below the opening OP. As shown in FIG. 2, the opening OP may have a rectangular planar shape. Alternatively, as shown in FIG. 3, the opening OP may have a circular planar shape. The present inventive concepts, however, are not limited thereto, and the planar shape of the opening OP may be variously changed if necessary.

A bump structure 130 may be provided on the pad 112. For example, the bump structure 130 may be positioned within the opening OP of the protective layer 114. The bump structure 130 may be coupled to the top surface of the pad 112 exposed by the opening OP. For example, a bottom surface of the bump structure 130 may contact an upper surface of the pad 112. In the opening OP, the bump structure 130 may be spaced apart from the protective layer 114. For example, the opening OP may be provided therein with a gap GAP that remains after the formation of the bump structure 130. The protective layer 114 and the bump structure 130 may be spaced apart from each other across the gap GAP.

The bump structure 130 may include a metal layer 132 and a solder ball 134. The metal layer 132 and the solder ball 134 may be sequentially stacked on the pad 112. For example, the metal layer 132 may be disposed on the pad 112, and the solder ball 134 may be disposed on the metal layer 132.

In the opening OP, the metal layer 132 may be in contact with the top surface of the pad 112. A top surface 132a of the metal layer 132 may be located at a higher level from the substrate 110 than that of a top surface 114a of the protective layer 114. For example, the metal layer 132 may protrude beyond the top surface 114a of the protective layer 114.

A planar shape of the metal layer 132 may be substantially the same as or similar to that of the opening OP. For example, as shown in FIG. 2, the metal layer 132 may have a rectangular planar shape. Alternatively, as shown in FIG. 3, the metal layer 132 may have a circular planar shape. The present inventive concepts, however, are not limited thereto, and the planar shape of the metal layer 132 may be variously changed if necessary. In this description, the phrase "planar shapes of two components are the same as or similar to each other." may mean only that "the two components have the same shape", but not that "the two components have the same size."

When viewed in a plan view, the metal layer 132 may be positioned within the opening OP. The planar shape of the metal layer 132 may be smaller than that of the opening OP. Therefore, the metal layer 132 may be spaced apart from the protective layer 114. For example, the gap GAP between the protective layer 114 and the bump structure 130 may indicate an interval (e.g., a distance or spacing) between the metal layer 132 and an inner sidewall OPa of the opening OP. When measured from the top surface of the pad 112, a first width w1 of the metal layer 132 may be less than a second width w2 of the opening OP. For example, the first width w1 of the metal layer 132 may be about 0.85 times to about 0.95 times the second width w2 of the opening OP. For more detail, the first width w1 of the metal layer 132 may be about $^{25}\!/_{29}$ times to about $^{11}\!/_{12}$ times the second width w2 of the opening OP.

When the first width w1 of the metal layer 132 is less than about 0.85 times the second width w2 of the opening OP, an area of the metal layer 132 may be excessively reduced to degrade electrically properties of a semiconductor device. Alternatively, an area of the opening OP may be dramatically increased to increase an area of a semiconductor device. When the first width w1 of the metal layer 132 is greater than about 0.95 times the second width w2 of the opening OP, an adhesive layer may remain in the gap GAP between the metal layer 132 and the protective layer 114 in fabricating a semiconductor device. This will be discussed below in detail in a method of fabricating a semiconductor device. A value of about 6.5 μm or higher may be given to a difference between the first width w1 of the metal layer 132 and the second width w2 of the opening OP. A value of about 3.5 μm or higher may be given to the gap GAP between the metal layer 132 and the protective layer 114, or an interval between the metal layer 132 and the inner sidewall OPa of the opening OP.

According to some embodiments of the present inventive concepts, it may be possible to provide a semiconductor device in which the metal layer 132 and the protective layer 114 are not provided therebetween with a residual adhesive layer that can occur during a semiconductor fabrication process, while preventing a degradation of electrically properties of the semiconductor device and an increase in area of the semiconductor device. Thus, there may be provided a semiconductor device with less contamination and increased structural stability.

As shown in FIG. 4, a lateral surface 132b of the metal layer 132 and the inner sidewall OPa of the opening OP may each be perpendicular to the top surface of the pad 112. For example, the lateral surface 132b of the metal layer 132 may be parallel to the inner sidewall OPa of the opening OP. The gap GAP between the metal layer 132 and the protective layer 114, or an interval between the metal layer 132 and the inner sidewall OPa of the opening OP may be constant irrespective of distance from the top surface of the pad 112.

The metal layer 132 may include a metallic material. For example, the metal layer 132 may include copper (Cu) or nickel (Ni).

Although not shown, a seed layer may be interposed between the metal layer 132 and the pad 112. The seed layer may include gold (Au).

The solder ball 134 may be disposed on the metal layer 132. The metal layer 132 may separate the solder ball 134 from the pad 112. A third width w3 of the solder ball 134 may be greater than the first width w1 of the metal layer 132. The third width W3 may be the maximum width of the solder ball 134. An interface between the solder ball 134 and the metal layer 132 may be located at a higher level from the top surface of the pad 112 than that of the top surface 114a of the protective layer 114. Therefore, an interval (e.g., a distance or spacing) between the protective layer 114 and the solder ball 134 may be greater than that between the protective layer 114 and the metal layer 132. The solder ball 134 may include a soldering material for bonding. For example, the solder ball 134 may include one or more of tin (Sn), silver (Ag), copper (Cu), zinc (Zn), lead (Pb), and any alloy thereof.

In the embodiments that follow, a detailed description of technical features repetitive to those discussed with reference to FIGS. 1 to 4 will be omitted for convenience of description, and a difference thereof will be discussed in detail. The same components as those of the semiconductor device discussed above will be allocated the same reference numerals thereto.

Figure 5:
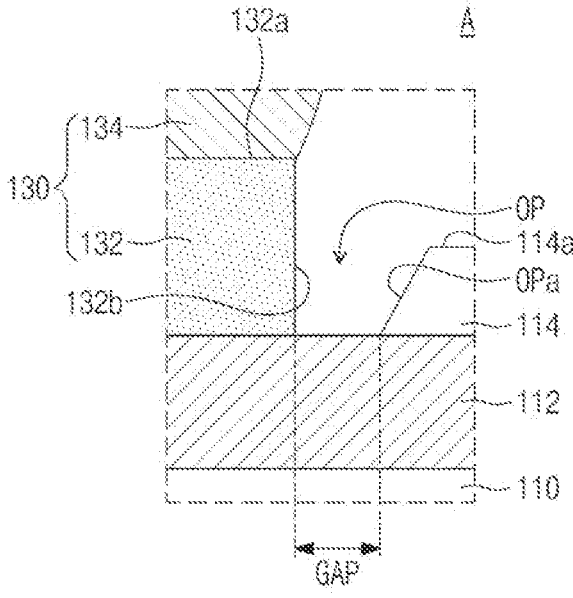

FIG. 5 illustrates a cross-sectional view showing a semiconductor device according to some example embodiments of the present inventive concepts, corresponding to an enlarged view of section A depicted in FIG. 1.

Referring to FIGS. 1 to 3 and 5, the lateral surface 132b of the metal layer 132 may be perpendicular to the top surface of the pad 112. The inner sidewall OPa of the opening OP may be a first inclination surface that is inclined to the top surface of the pad 112. In this configuration, the lateral surface 132b of the metal layer 132 may not be parallel to the inner sidewall OPa of the opening OP. For example, the gap GAP between the metal layer 132 and the protective layer 114, or an interval between the first inclination surface OPa and the lateral surface 132b of the metal layer 132 may increase in a direction away from the top surface of the pad 112.

According to some embodiments of the present inventive concepts, the gap GAP between the metal layer 132 and the protective layer 114 may have a width that decreases in a direction toward a floor of the gap GAP. For example, the gap GAP may have a shape whose entrance is wide and whose floor is narrow. Therefore, in a subsequent process during semiconductor fabrication, it may be possible to easily remove an adhesive layer introduced between the metal layer 132 and the protective layer 114. Thus, there may be provided a semiconductor device with less contamination and increased structural stability. This will be discussed below in detail in a method of fabricating a semiconductor device.

Figure 6:
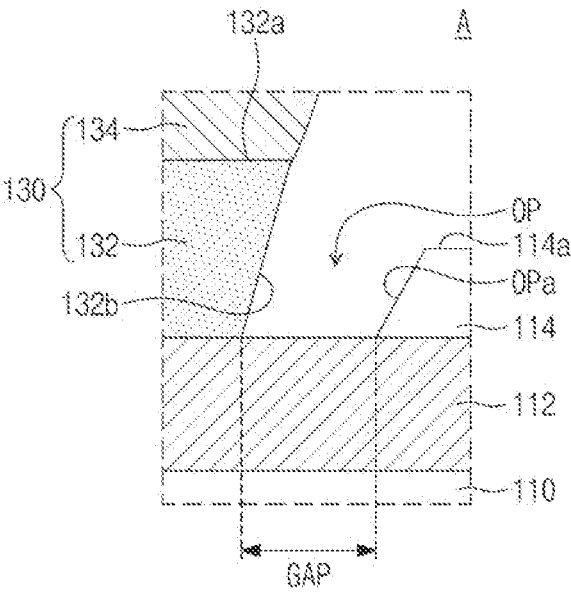

FIG. 6 illustrates a cross-sectional view showing a semiconductor device according to some example embodiments of the present inventive concepts, corresponding to an enlarged view of section A depicted in FIG. 1.

Referring to FIGS. 1 to 3 and 6, the inner sidewall OPa of the opening OP may be a first inclination surface that is inclined to the top surface of the pad 112. The lateral surface 132b of the metal layer 132 may be a second inclination surface that is inclined to the top surface of the pad 112. The lateral surface 132b of the metal layer 132 may be parallel to or may not be parallel to the inner sidewall OPa of the opening OP. For example, the lateral surface 132b of the metal layer 132 may not be parallel to the inner sidewall OPa of the opening OP, and an interval between the first inclination surface OPa and the second inclination surface 132b of the metal layer 132 may increase in a direction away from the top surface of the pad 112. When the lateral surface 132b of the metal layer 132 is parallel to the inner sidewall OPa of the opening OP, an interval between the first inclination surface OPa and the second inclination surface 132b of the metal layer 132 may be constant irrespective of the top surface of the pad 112.

According to some embodiments of the present inventive concepts, even when the metal layer 132 has a width that increases in a direction away from the pad 112, the gap GAP between the metal layer 132 and the protective layer 114 may have a width that is constant or decreases in a direction toward a floor of the gap GAP. Therefore, in a subsequent process during semiconductor fabrication, it may be possible to easily remove an adhesive layer introduced between the metal layer 132 and the protective layer 114. Thus, there may be provided a semiconductor device with less contamination and increased structural stability.

Figure 7:
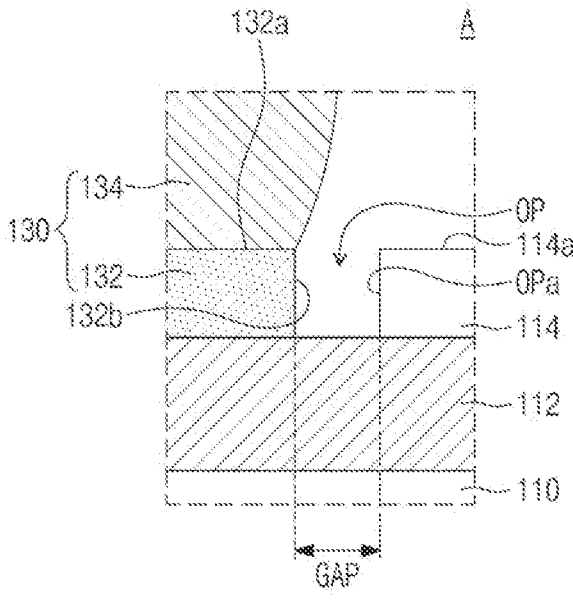

FIG. 7 illustrates a cross-sectional view showing a semiconductor device according to some example embodiments of the present inventive concepts, corresponding to an enlarged view of section A depicted in FIG. 1.

Referring to FIGS. 1 to 3 and 7, the top surface 132a of the metal layer 132 may be located at a level from the substrate 110 the same as or lower than that of the top surface 114a of the protective layer 114.

The solder ball 134 may be disposed on the metal layer 132. The metal layer 132 may separate the solder ball 134 from the pad 112. A third width w3 of the solder ball 134 may be greater than the first width w1 of the metal layer 132. Therefore, an interval between the protective layer 114 and the solder ball 134 may be greater than that between the protective layer 114 and the metal layer 132.

According to some embodiments of the present inventive concepts, an interval between the solder ball 134 and the protective layer 114 adjacent to an entrance of the gap GAP between the metal layer 132 and the protective layer 114 may be greater than that between the metal layer 132 and the protective layer 114 adjacent to a floor of the gap GAP. Therefore, in a subsequent process during semiconductor fabrication, it may be possible to easily remove an adhesive layer introduced between the metal layer 132 and the protective layer 114. Thus, there may be provided a semiconductor device with less contamination and increased structural stability.

Figure 8:
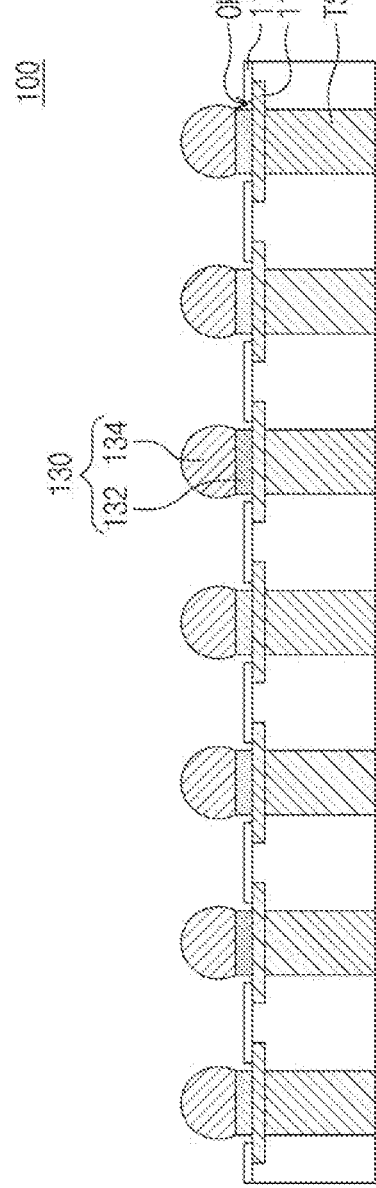
FIG. 8 illustrates a cross-sectional view showing a semiconductor device, according to some example embodiments of the present inventive concepts.

FIG. 8 illustrates a cross-sectional view showing a semiconductor device according to some example embodiments of the present inventive concepts.

Referring to FIG. 8, a semiconductor device discussed with reference to FIGS. 1 to 7 may be a semiconductor chip 100.

The semiconductor chip 100 may include a plurality of pads 112 provided on one surface thereof and a protective layer 114 having openings OP that expose the pads 112. According to some embodiments, as shown in FIG. 8, the pads 112 may be uniformly disposed on a front surface of the semiconductor chip 100. According to other embodiments, differently from that shown in FIG. 8, the pads 112 may be disposed on an edge or central portion of the semiconductor chip 100. The semiconductor chip 100 may have one of a memory circuit, a logic circuit, and a combination thereof, all of which circuits is electrically connected to the pads 112.

Bump structures 130 may be provided on corresponding pads 112. In the openings OP, the bump structures 130 may be coupled to corresponding pads 112. For example, lower surfaces of the bump structures 130 may contact upper surfaces of the corresponding pads 112. According to some embodiments, as shown in FIG. 8, the bump structures 130 and the protective layer 114 may be substantially the same as the bump structures 130 and the protective layer 114, respectively, discussed with reference to FIGS. 1 to 4. According to other embodiments, the bump structure 130 and the protective layer 114 may be respectively replaced with the bump structures 130 and the protective layer 114 discussed with reference to FIG. 5, 6, or 7. A metal layer 132 included in each of the bump structures 130 may have a width about 0.85 times to about 0.95 times a width of the opening OP in the protective layer 114. For example, the width of the metal layer 132 included in each of the bump structures 130 may be about $25/29$ times to about $11/12$ times the width of each of the openings OP in the protective layer 114.

The semiconductor chip 100 may further include through electrodes TSV. The through electrodes TSV may vertically penetrate the semiconductor chip 100. The through electrodes TSV may be coupled to the pads 112. The through electrodes TSV may be connected either to a memory circuit, a logic circuit, or a combination thereof formed in the semiconductor chip 100, or to an external apparatus through a rear surface (or pads provided on the rear surface) of the semiconductor chip 100. The present inventive concepts, however, are not limited thereto, and the through electrodes TSV may not be provided if necessary.

Figure 9:
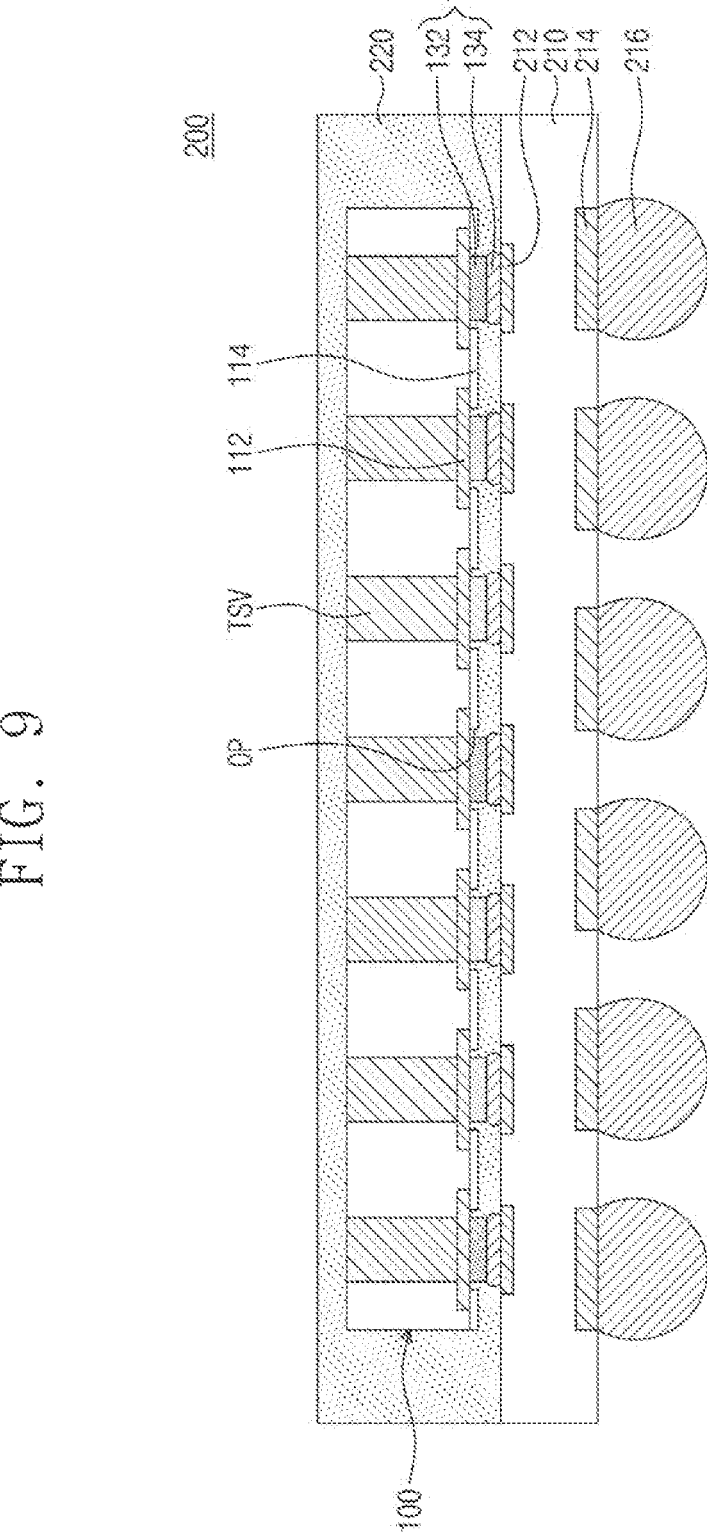
FIG. 9 illustrates a cross-sectional view showing a semiconductor device, according to some example embodiments of the present inventive concepts.

FIG. 9 illustrates a cross-sectional view showing a semiconductor device according to some example embodiments of the present inventive concepts.

Referring to FIG. 9, a semiconductor package 200 may include a package substrate 210 and a semiconductor chip 100 mounted on the package substrate 210. The semiconductor chip 100 may be substantially the same as that discussed with reference to FIG. 8. For example, the semiconductor chip 100 may include a plurality of pads 112 provided on one surface thereof and a protective layer 114 having a pattern including openings OP that expose the pads 112. Bump structures 130 may be provided on corresponding pads 112. The semiconductor chip 100 may further include through electrodes TSV that vertically penetrate the semiconductor chip 100 and are coupled to the pads 112.

The package substrate 210 may include connection pads 212 provided on a top surface thereof and external pads 214 provided on a bottom surface thereof. The external pads 214 may be provided thereon with external terminals 216.

The semiconductor chip 100 may be flip-chip mounted on the package substrate 210. The semiconductor chip 100 may be aligned to allow the bump structures 130 to face toward the top surface of the package substrate 210, and the bump structures 130 may be coupled to the connection pads 212. For example, solder balls (see solder balls 134 of FIG. 1) included in the bump structures 130 may be soldered to the connection pads 212, and thus the semiconductor chip 100 may be mounted on the package substrate 210.

As shown in FIG. 9, the bump structures 130 and the protective layer 114 may be substantially the same as the bump structures 130 and the protective layer 114 discussed with reference to FIGS. 1 to 4. According to other embodiments, the bump structure 130 and the protective layer 114 may be respectively replaced with the bump structures 130 and the protective layer 114 discussed with reference to FIG. 5, 6, or 7. A metal layer 132 included in each of the bump structures 130 may have a width about 0.85 times to about 0.95 times a width of each of the openings OP in the protective layer 114. For example, the width of the metal layer 132 included in each of the bump structures 130 may be about $25/29$ times to about $11/12$ times the width of each of the openings OP in the protective layer 114.

The package substrate 210 may be provided on its top surface with a molding layer 220 that covers the semiconductor chip 100. The molding layer 220 may include, for example, an epoxy molding compound (EMC). According to some embodiments, an under-fill layer (not shown) may further be provided between the semiconductor chip 100 and the package substrate 210.

Figure 10:
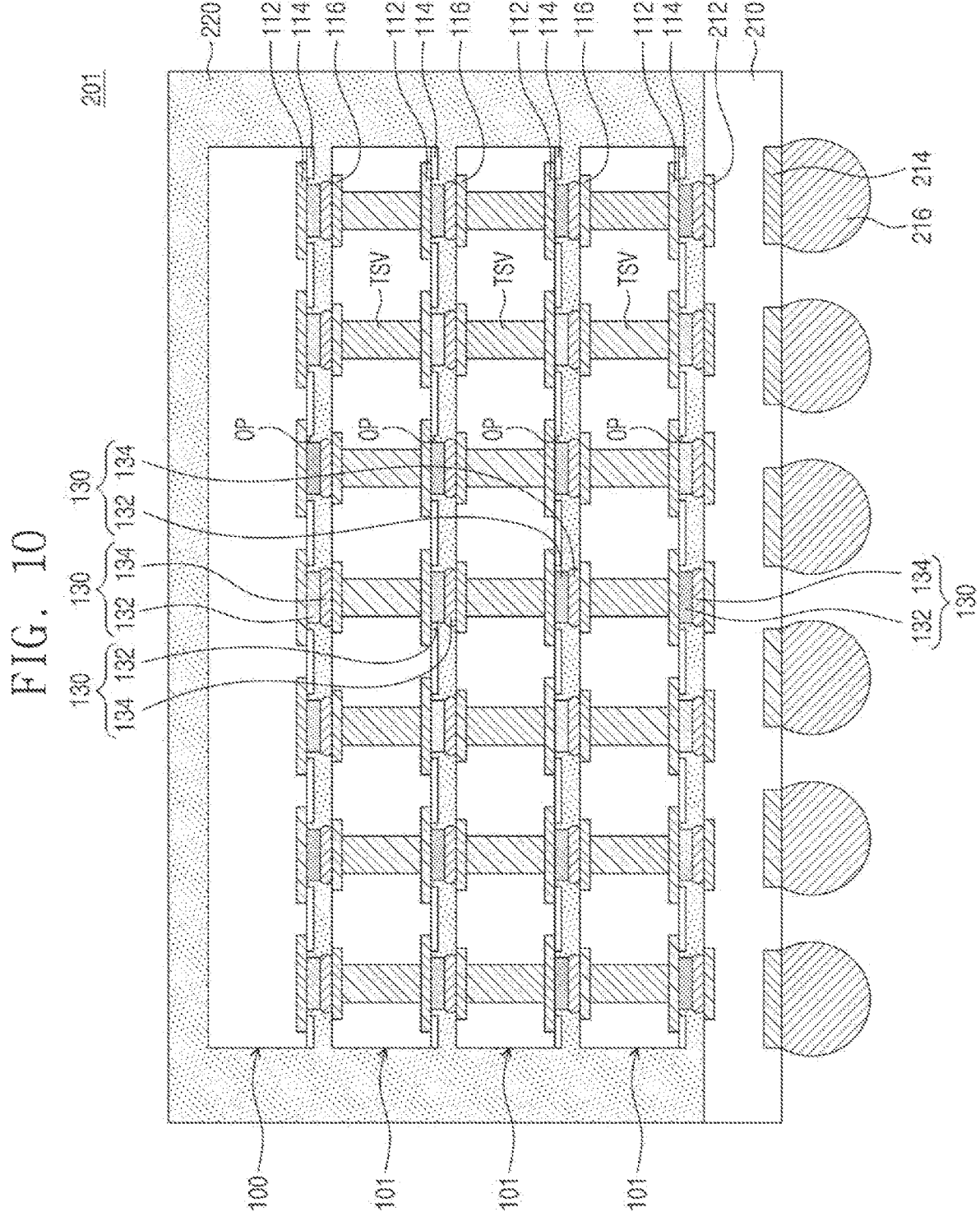
FIG. 10 illustrates a cross-sectional view showing a semiconductor device, according to some example embodiments of the present inventive concepts.

FIG. 10 illustrates a cross-sectional view showing a semiconductor device according to some example embodiments of the present inventive concepts.

Referring to FIG. 10, a semiconductor package 201 may include a package substrate 210 and semiconductor chips 100 and 101 mounted on the package substrate 210.

The package substrate 210 may be substantially the same as that discussed with reference to FIG. 9. A detailed description of the package substrate 210 will be omitted.

The semiconductor chips 100 and 101 may be mounted on a top surface of the package substrate 210. For example, a first semiconductor chip 100 may be provided on the top surface of the package substrate 210, and second semiconductor chips 101 may be provided between the first semiconductor chip 100 and the package substrate 210. The first semiconductor chip 100 and the second semiconductor chips 101 may each be substantially the same as the semiconductor chip 100 discussed with reference to FIG. 8. For example, the first semiconductor chip 100 and the second semiconductor chips 101 may each include a plurality of pads 112 provided thereon and a protective layer 114 having a pattern that exposes the pads 112. Bump structures 130 may be provided on corresponding pads 112.

The second semiconductor chips 101 may further include through electrodes TSV that penetrate the second semiconductor chip 101, and may also include additional pads 116 connected to the through electrodes TSV and disposed opposite to the pads 112. The first semiconductor chip 100 may include neither through electrodes TSV that penetrate the first semiconductor chip 100 nor additional pads 116 connected to the through electrodes TSV and disposed opposite to the pads 112. The first semiconductor chip 100 may have a thickness greater than those of the second semiconductor chips 101. Alternatively, the first semiconductor chip 100 may have a thickness the same as those of the second semiconductor chips 101.

The first semiconductor chip 100 may be electrically connected to the second semiconductor chip 101 disposed thereunder. For example, the bump structures 130 included in the first semiconductor chip 100 may be coupled to the additional pads 116 included in the second semiconductor chip 101 that underlies the first semiconductor chip 100.

Each of the second semiconductor chips 101 may be electrically connected to either the second semiconductor chip 101 disposed thereunder or the package substrate 210. For example, the bump structures 130 included in a lowermost second semiconductor chip 101 may be coupled to connection pads 212 of the package substrate 210, and the bump structures 130 included in another second semiconductor chip 101 may be coupled to the additional pads 116 included in the second semiconductor chip 101 below the another second semiconductor chip 101.

As shown in FIG. 10, the bump structures 130 and the protective layer 114 may be substantially the same as the bump structures 130 and the protective layer 114, respectively, discussed with reference to FIGS. 1 to 4. According to other embodiments, the bump structure 130 and the protective layer 114 may be respectively replaced with the bump structures 130 and the protective layer 114 discussed with reference to FIG. 5, 6, or 7. A metal layer 132 included in each of the bump structures 130 may have a width about 0.85 times to about 0.95 times a width of each of the openings OP in the protective layer 114. For example, the width of the metal layer 132 included in each of the bump structures 130 may be about $^{25}/_{29}$ times to about $^{11}/_{12}$ times the width of each of the openings OP in the protective layer 114.

The package substrate 210 may be provided on its top surface with a molding layer 220 that covers the semiconductor chips 100 and 101. According to some embodiments, under-fill layers (not shown) may further be provided between the semiconductor chips 100 and 101 and between the lowermost second semiconductor chip 101 and the package substrate 210.

Figure 11:
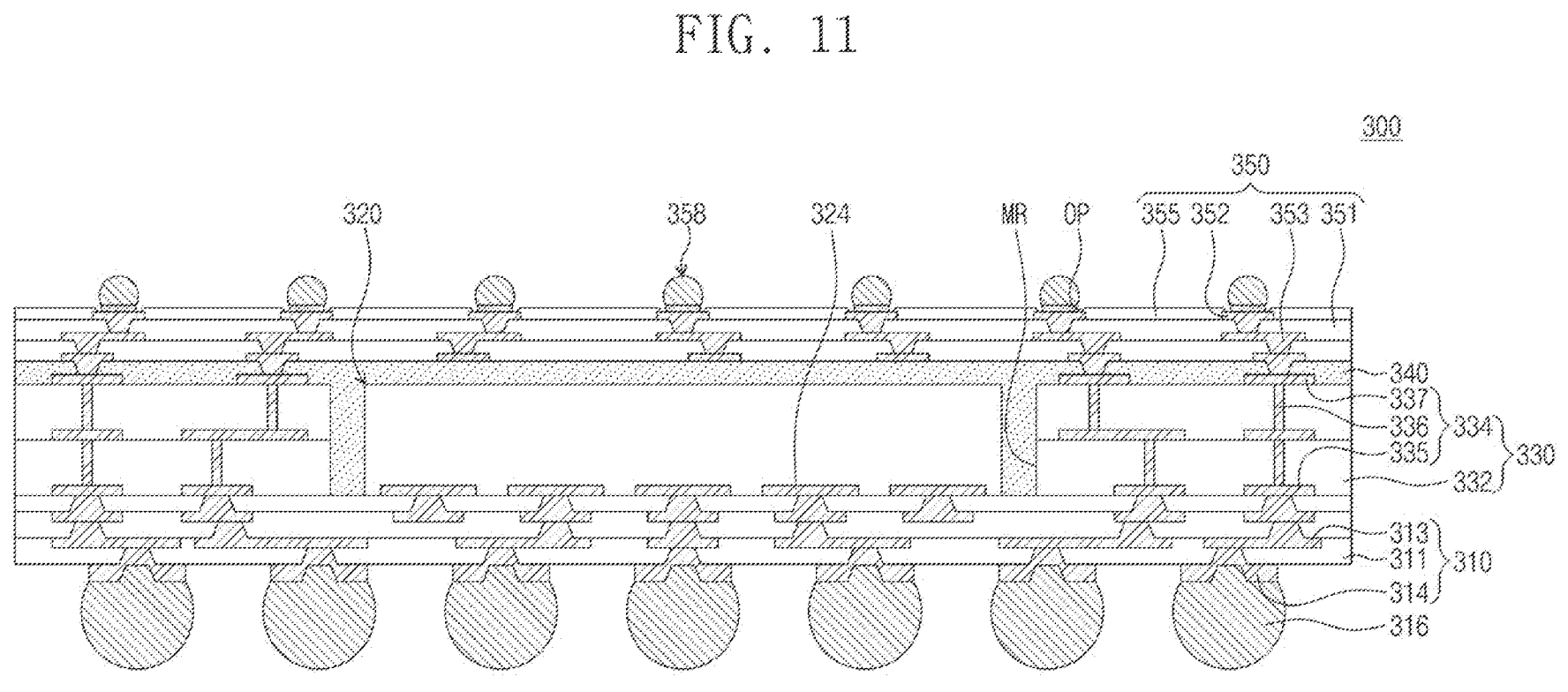

FIG. 11 illustrates a cross-sectional view showing a semiconductor device according to some embodiments of the present inventive concepts.

Referring to FIG. 11, a semiconductor package 300 may include a package substrate 310, a semiconductor chip 320 mounted on the package substrate 310, a connection substrate 330, a molding layer 340, and a redistribution layer 350.

The package substrate 310 may include dielectric patterns 311 stacked on each other, conductive patterns 313 that constitute a wiring pattern within the dielectric patterns 311, and external pads 314 provided on a bottom surface of the package substrate 310. A portion of the conductive patterns 313 may be exposed on a top surface of the package substrate 310 and may serve as an upper pad of the package substrate 310. The external pads 314 may extend into the dielectric patterns 311 to be coupled to the conductive patterns 313. The external pads 314 may be provided thereon with external terminals 316.

The connection substrate 330 may be disposed on the package substrate 310. The connection substrate 330 may include a mounting region MR that penetrates therethrough. For example, the mounting region MR may have an open hole that connects top and bottom surfaces of the connection substrate 330. The bottom surface of the connection substrate 330 may be spaced apart from the top surface of the package substrate 310. The connection substrate 330 may include a base layer 332 and a conductive member 334 that is a wiring pattern provided in the base layer 332. For example, the base layer 332 may include silicon oxide. The conductive member 334 may be disposed far away from the connection substrate 330, and the mounting region MR may be disposed close to the connection substrate 330. The conductive member 334 may include lower pads 335, vias 336, and upper pads 337. The lower pads 335 may be disposed in a lower portion of the connection substrate 330. The upper pads 337 may be located on the top surface of the connection substrate 330. The vias 336 may penetrate the base layer 332 and may electrically connect the lower pads 335 to the upper pads 337.

The connection substrate 330 may be mounted on the package substrate 310. For example, the bottom surface of the connection substrate 330 may be in contact with the top surface of the package substrate 310. The lower pads 335 of the connection substrate 330 may be in contact with the conductive patterns 313 exposed on the top surface of the package substrate 310. For example, some of the conductive patterns 313 of the package substrate 310 may penetrate an uppermost dielectric pattern 311 to be coupled to the lower pads 335 of the connection substrate 330. Therefore, the connection substrate 330 may be electrically connected to the semiconductor chip 320 and the external terminals 316.

The semiconductor chip 320 may be disposed on the package substrate 310. The semiconductor chip 320 may include a plurality of chip pads 324 provided on one surface thereof.

The semiconductor chip 320 may be mounted on the package substrate 310. The semiconductor chip 320 may be provided in the mounting region MR of the connection substrate 330. The semiconductor chip 320 may be aligned to allow the chip pads 324 to face toward the top surface of the package substrate 310. A bottom surface (or active surface) of the semiconductor chip 320 may be in contact with the top surface of the package substrate 310. In this case, the chip pads 324 of the semiconductor chip 320 may be in contact with the conductive patterns 313 exposed on the top surface of the package substrate 310. For example, some of the conductive patterns 313 of the package substrate 310 may penetrate an uppermost dielectric pattern 311 to be coupled to the chip pads 324 of the semiconductor chip 320.

A molding layer 340 may fill a space between the semiconductor chip 320 and the connection substrate 330. The molding layer 340 may include, for example, an epoxy molding compound (EMC).

The redistribution layer 350 may further be included. The redistribution layer 350 may be provided on a top surface of the molding layer 340 and the top surface of the connection substrate 330. The redistribution layer 350 may correspond to the semiconductor device discussed with reference to FIGS. 1 to 7. For example, the redistribution layer 350 may include dielectric patterns 351 that are stacked on each other, upper pads 352 that are provided on one surface of the redistribution layer 350, conductive patterns 353 that are provided in the dielectric patterns 351 and connected to the upper pads 352, and a protective layer 355 having openings OP that expose the upper pads 352. The dielectric patterns 351 may cover the molding layer 340. The conductive patterns 353 may penetrate the dielectric patterns 351 and the molding layer 340 to be coupled to the upper pads 337 of the connection substrate 330. Bump structures 358 may be provided on corresponding chip pads 324.

The bump structures 358 and the protective layer 355 may be substantially the same as the bump structures 130 and the protective layer 114, respectively, discussed with reference to FIGS. 1 to 4. According to other embodiments, the bump structure 358 and the protective layer 355 may be respectively replaced with the bump structures 130 and the protective layer 114 discussed with reference to FIG. 5, 6, or 7. A metal layer (see metal layer 132 of FIG. 1) included in each of the bump structures 358 may have a width about 0.85 times to about 0.95 times a width of each of the openings OP in the protective layer 355. For example, the width of the metal layer 132 included in each of the bump structures 358 may be about $^{25}/_{29}$ times to about $^{11}/_{12}$ times the width of each of the openings OP in the protective layer 355.

Figure 12:
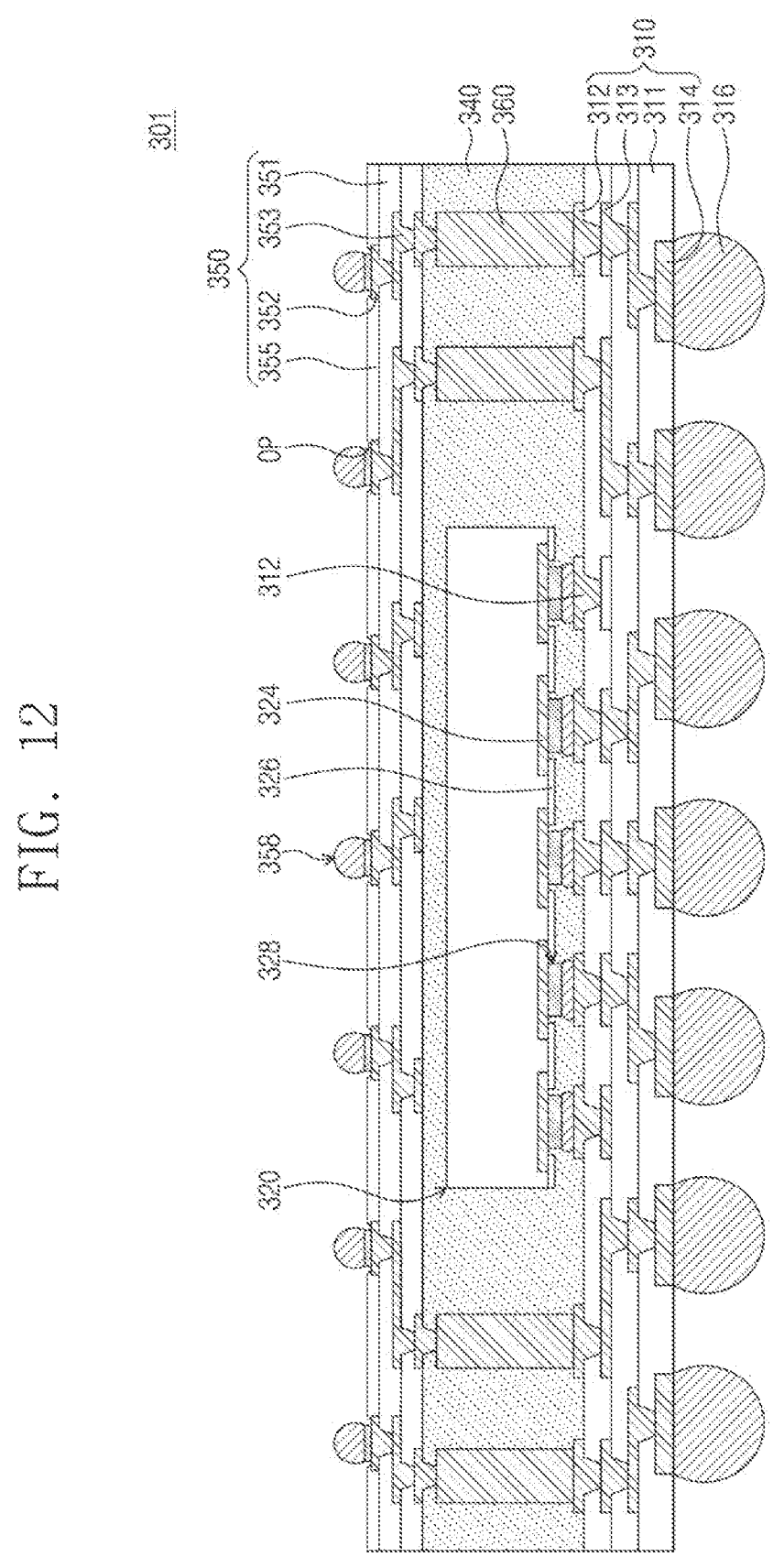

FIG. 12 illustrates a cross-sectional view showing a semiconductor device according to some embodiments of the present inventive concepts.

Referring to FIG. 12, a semiconductor package 301 may be the same as or similar to the semiconductor package (see semiconductor package 300 of FIG. 11) discussed with reference to FIG. 11, but may not have the connection substrate (see connection substrate 330 of FIG. 11).

The package substrate 310 may include dielectric patterns 311 that are stacked on each other, connection pads 312 that are provided on a top surface of the package substrate 310, external pads 314 that are provided on a bottom surface of the package substrate 310, and conductive patterns 313 that are provided in the dielectric patterns 311 and connect the connection pads 312 to the external pads 314. The external pads 314 may be provided thereon with external terminals 316. Alternatively, as shown in FIG. 11, the package substrate 310 may not separately have the connection pads 312, and the connection pads 312 may be replaced with the conductive pads 313 that are exposed on the top surface of the package substrate 310.

The semiconductor chip 320 may be substantially the same as the semiconductor chip 100 discussed with reference to FIG. 8. For example, the semiconductor chip 320 may include a semiconductor substrate 322 and an electrical bump structure 328. The semiconductor substrate 322 may include a plurality of chip pads 324 provided on one surface thereof and a protective layer 326 having a pattern that exposes the chip pads 324. Bump structures 328 may be provided on corresponding chip pads 324.

The semiconductor chip 320 may be flip-chip mounted on the package substrate 310. The semiconductor chip 320 may be provided in the mounting region MR of the connection substrate 330. The semiconductor chip 320 may be aligned to allow the bump structures 328 to face toward the top surface of the package substrate 310, and the bump structures 328 may be coupled to the connection pads 312. For example, solder balls (see solder balls 134 of FIG. 1) included in the bump structures 328 may be soldered to connection pads 312, and thus the semiconductor chip 320 may be mounted on the package substrate 310.

The bump structures 328 and the protective layer 326 may be substantially the same as the bump structures 130 and the protective layer 114 discussed with reference to FIGS. 1 to

4. According to other embodiments, the bump structure 328 and the protective layer 326 may be respectively replaced with the bump structures 130 and the protective layer 114 discussed with reference to FIG. 5, 6, or 7. A metal layer 132 included in each of the bump structures 328 may have a width about 0.85 times to about 0.95 times a width of each of the openings (see OP of FIG. 1) in the protective layer 326. For example, the width of the metal layer 132 included in each of the bump structures 328 may be about $^{25}/_{29}$ times to about $^{11}/_{12}$ times the width of each of the openings OP in the protective layer 326. According to other embodiments, the semiconductor chip 320 may be different from the semiconductor chip 100 discussed with reference to FIG. 8.

FIG. 12 shows that the semiconductor chip 320 is flip-chip mounted, but the present inventive concepts are not limited thereto. As shown in FIG. 11, the conductive patterns 313 of the package substrate 310 may be directly connected to the chip pads 324 of the semiconductor chip 320, without configurations of the bump structures 328. The following description will focus on the embodiment of FIG. 12.

The molding layer 340 may fill a space between the package substrate 310 and the redistribution layer 350. For example, the molding layer 340 may surround the semiconductor chip 320 between the package substrate 310 and the redistribution layer 350.

The semiconductor package 301 may further include a through electrode 360 that connects the package substrate 310 to the redistribution layer 350. The through electrode 360 may be disposed laterally spaced apart from the semiconductor chip 320. The through electrode 360 may vertically penetrate the molding layer 340. The through electrode 360 may be coupled to the package substrate 310. For example, the through electrode 360 may be connected to the connection pad 312 of the package substrate 310. A bottom surface of the through electrode 360 may be in contact with a top surface of the connection pad 312. The through electrode 360 may be electrically connected through the package substrate 310 to the external terminal 316 or the semiconductor chip 320. The through electrode 360 may include a metal pillar. The conductive patterns 353 of the redistribution layer 350 may penetrate the dielectric patterns 351 and the molding layer 340 to be coupled to a top surface of the through electrode 360.

Figure 14:
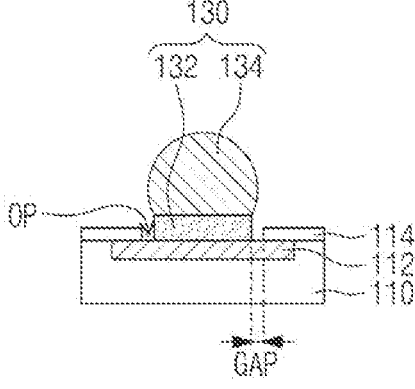
Figure 15:
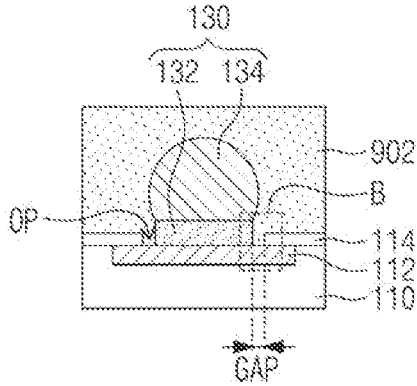
Figure 16:
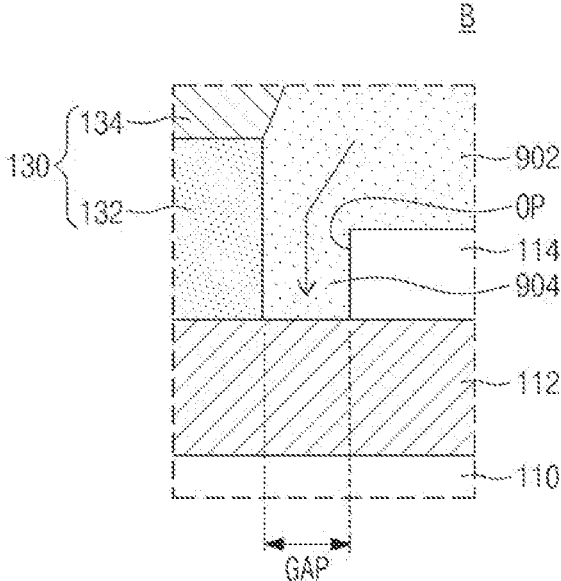
Figure 17:
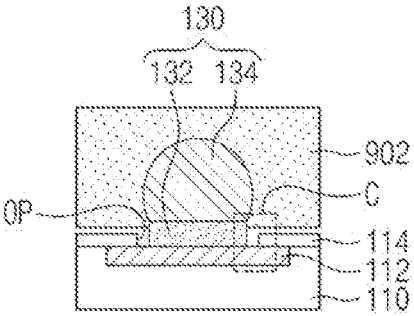
Figure 18:
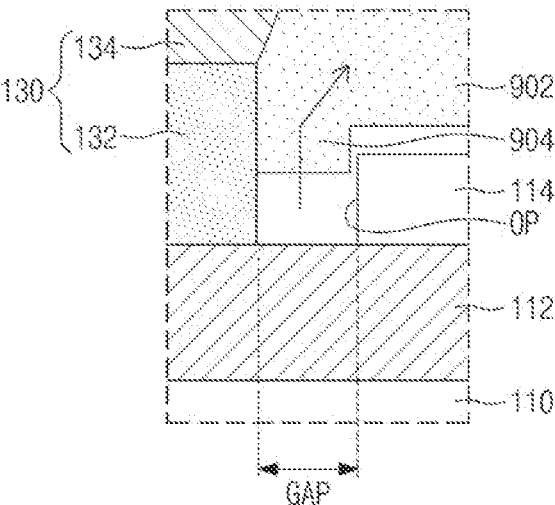
Figure 19:
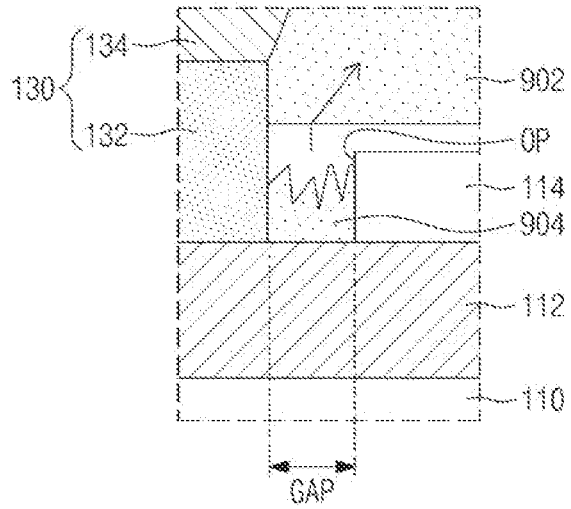
Figure 20:
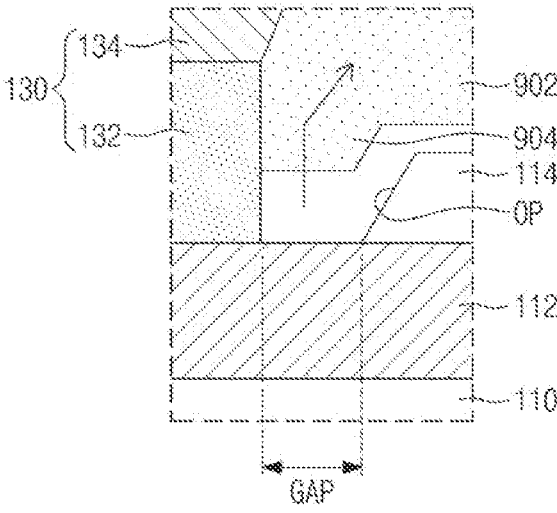

FIGS. 13 to 20 illustrate cross-sectional views showing a method of fabricating a semiconductor device according to some example embodiments of the present inventive concepts. FIGS. 13 to 15 and 17 correspond to a cross-section of a semiconductor device. FIG. 16 illustrates an enlarged view showing section B depicted in FIG. 15. FIGS. 18 to 20 illustrate enlarged views showing section C depicted in FIG. 17.

Figure 13:
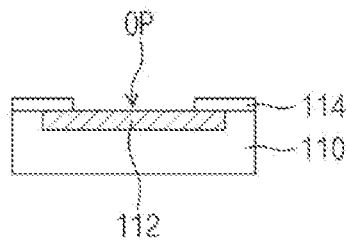
FIGS. 13 to 20 illustrate cross-sectional views showing a method of fabricating a semiconductor device, according to some example embodiments of the present inventive concepts.

Referring to FIG. 13, the substrate 110 may be provided. The substrate 110 may be a semiconductor substrate, such as a silicon (Si) wafer or a germanium (Ge) wafer. The substrate 110 may include a pad 112 provided on one surface thereof and a protective layer 114 having an opening OP that exposes the pad 112. The substrate 110 may have one of a memory circuit, a logic circuit, and a combination thereof, all of which circuits is electrically connected to the pad 112.

Referring to FIG. 14, a bump structure 130 may be formed on the substrate 110. For example, a metal layer 132 may be formed on the pad 112, and then a solder ball 134 may be formed on the metal layer 132.

A mask pattern may be formed on the substrate 110 to partially cover a top surface of the pad 112, and then a pattern of the mask pattern may be filled with a metallic material to form the metal layer 132. The formation of the mask pattern may include coating a photoresist layer and using a photolithography process to pattern the photoresist layer. The formation of the metal layer 132 may include performing a plating process. For example, the metal layer 132 may be formed by using a pulse plating process. In this case, the metal layer 132 may be formed through a plating process that uses a pulsed current.

When measured from the top surface of the pad 112, a first width of the metal layer 132 may be less than a second width of the opening OP. For example, the first width of the metal layer 132 may be about 0.85 times to about 0.95 times the second width of the opening OP. For more detail, the first width of the metal layer 132 may be about $25/29$ times to about $11/12$ times the second width of the opening OP. A value of about 6.5 μm or higher may be given to a difference between the first width of the metal layer 132 and the second width of the opening OP. A value of about 3.5 μm or higher may be given to a gap GAP between the metal layer 132 and the protective layer 114, or an interval between the metal layer 132 and an inner sidewall of the opening OP. Although not shown, in the pulse plating process, a seed layer may be used as a seed.

The solder ball 134 may be formed on the metal layer 132. The solder ball 134 may be formed by using a direct-current plating process. According to some embodiments, the plating process for forming the metal layer 132 and the plating process for forming the solder ball 134 may be performed in-situ. The present inventive concepts, however, are not limited thereto. For example, the solder ball 134 may include one or more of tin (Sn), silver (Ag), copper (Cu), zinc (Zn), lead (Pb), and any alloy thereof.

Referring to FIGS. 15 and 16, a carrier substrate (not shown) may be attached to the substrate 110. The carrier substrate may be provided to perform a subsequent process on a rear surface (or a bottom surface of FIG. 14) of the substrate 110. For example, a process may be performed to form a wiring layer, substrate terminals, or connection terminals on the bottom surface of the substrate 110. The present inventive concepts, however, are not limited thereto. An adhesive layer 902 may be used to attach the carrier substrate to the substrate 110. On the substrate 110, the adhesive layer 902 may cover the protective layer 114 and bury the bump structure 130. As indicated by an arrow depicted in FIG. 16, a portion 904 of the adhesive layer 902 may be introduced into a space between the bump structure 130 and the protective layer 114.

Referring to FIGS. 17 and 18, the carrier substrate may be removed from the substrate 110. When the carrier substrate is removed, the adhesive layer 902 may also be removed. This step may also remove the portion 904 of the adhesive layer 902 introduced into the space between the bump structure 130 and the protective layer 114. According to some embodiments of the present inventive concepts, the first width of the metal layer 132 may be less than the second width of the opening OP, and thus the portion 904 of the adhesive layer 902 may be easily removed from the space between the bump structure 130 and the protective layer 114. For example, to easily remove the portion 904 of the adhesive layer 902, a value of about 6.5 μm or higher may be given to a difference between the first width of the metal layer 132 and the second width of the opening OP, and a value of about 3.5 μm or higher may be given to an interval between the metal layer 132 and the inner sidewall of the opening OP.

As shown in FIG. 19, differently from some embodiments of the present inventive concepts, when a gap between the protective layer 114 and the metal layer 132 is excessively small, a resistance that occurs between a lateral surface of the protective layer 114 and a lateral surface of the metal layer 132 may cause the portion 904 of the adhesive layer 902 to remain in the space between the bump structure 130 and the protective layer 114. In this case, the portion 904 of the adhesive layer 902 may not be removed together with the adhesive layer 902, but may be separated from the adhesive layer 902 to remain in the space between the bump structure 130 and the protective layer 114. For example, when a value less than about 6.5 μm is given to a difference between the first width of the metal layer 132 and the second width of the opening OP, or when a value less than about 3.5 μm is given to an interval between the metal layer 132 and the inner sidewall of the opening OP, the portion 904 of the adhesive layer 902 may be separated from the adhesive layer 902.

Referring to FIG. 20, as shown in FIGS. 5 and 6, when an interval between the metal layer 132 and the inner sidewall of the opening OP increase in a direction away from the top surface of the pad 112, the portion 904 of the adhesive layer 902 may be easily removed from the space between the bump structure 130 and the protective layer 114.

According to some embodiments of the present inventive concepts, a sufficiently large interval may be provided between the bump structure 130 and the protective layer 114, and thus the portion 904 of the adhesive layer 902 may be easily removed from the space between the bump structure 130 and the protective layer 114. The metal layer 132 and the protective layer 114 may not be provided therebetween with a residual adhesive layer that can occur in semiconductor fabrication process. Therefore, there may be provided a semiconductor fabrication method with less occurrence of failure. In addition, a sufficiently wide area of the bump structure 130 may be obtained to reduce a resistance between the pad 112 and the bump structure 130. Accordingly, there may be provided a method of fabricating a semiconductor device with increased electrically properties.

FIGS. 21 to 24 illustrate cross-sectional views showing a method of fabricating a semiconductor device according to some embodiments of the present inventive concepts.

Figure 21:
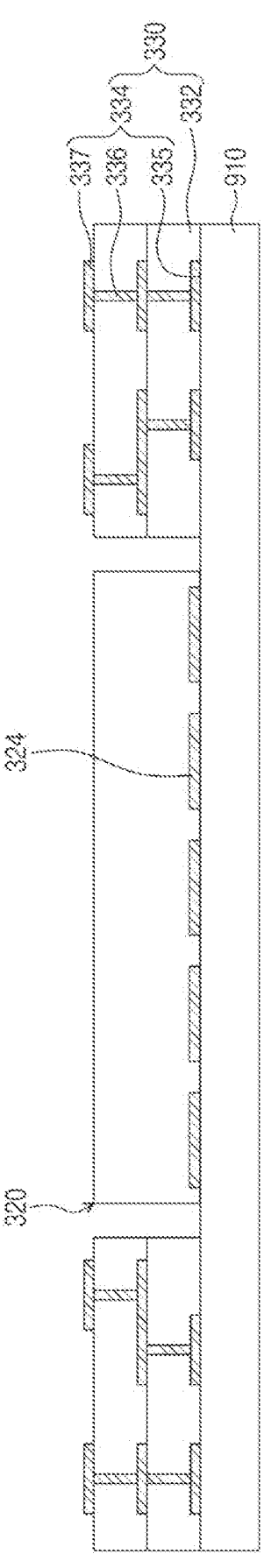
FIGS. 21 to 24 illustrate cross-sectional views showing a method of fabricating a semiconductor device, according to some example embodiments of the present inventive concepts.

Referring to FIG. 21, a first carrier substrate 910 may be provided. The first carrier substrate 910 may be a dielectric substrate including glass or polymer, or may be a conductive substrate including metal.

Although not shown, in some embodiments, an adhesive member may be provided on a top surface of the first carrier substrate 910. For example, the adhesive member may include a glue tape.

A connection substrate 330 may be provided in the first carrier substrate 910. The connection substrate 330 may be substantially the same as the connection substrate 330 discussed with reference to FIG. 11. For example, the connection substrate 330 may have a mounting region MR that penetrates therethrough. The connection substrate 330 may include a base layer 332 and a conductive member 334 that is a wiring pattern provided in the base layer 332. The conductive member 334 may be disposed away from the connection substrate 330, and the mounting region MR may be disposed close to the connection substrate 330. The conductive member 334 may include lower pads 335, vias 336, and upper pads 337. The lower pads 335 may be disposed in a lower portion of the connection substrate 330. The upper pads 227 may be located on a top surface of the connection substrate 330. The vias 336 may penetrate the base layer 332 and may electrically connect the lower pads 335 to the upper pads 337. The connection substrate 330 may be disposed on the first carrier substrate 910 to allow the lower pads 335 of the connection substrate 330 to face toward the first carrier substrate 910.

A semiconductor chip 320 may be provided on the first carrier substrate 910. The semiconductor chip 320 may be substantially the same as the semiconductor chip 100 discussed with reference to FIG. 11. For example, the semiconductor chip 320 may include a plurality of chip pads 324 provided on one surface thereof.

The semiconductor chip 320 may be disposed on the first carrier substrate 910 to allow the chip pads 324 of the semiconductor chip 320 to face toward the first carrier substrate 910. The semiconductor chip 320 may be positioned in the mounting region MR of the connection substrate 330.

Figure 22:
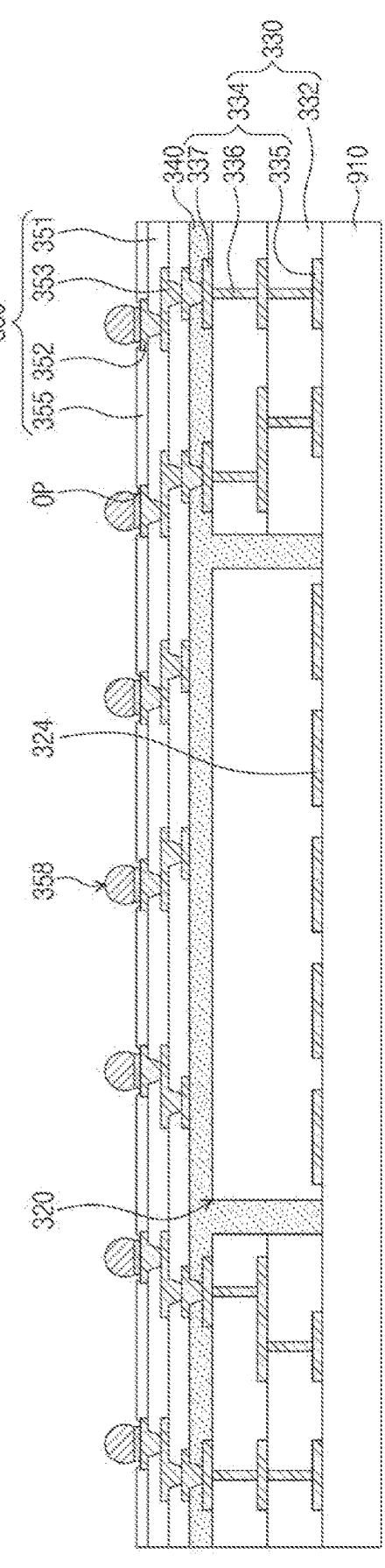

Referring to FIG. 22, a molding layer 340 may be formed on the first carrier substrate 910, thereby covering the semiconductor chip 320. The molding layer 340 may cover the connection substrate 330. The molding layer 340 may fill a space between the connection substrate 330 and the semiconductor chip 320. The molding layer 340 may include a dielectric resin, for example, an epoxy molding compound (EMC).

A redistribution layer 350 may be formed on the molding layer 340. For example, the molding layer 340 may be patterned to expose the upper pads 337 of the connection substrate 330. A conductive layer may be formed on the molding layer 340, and then the conductive layer may be patterned to form conductive patterns 353. A dielectric layer may be formed on the molding layer 340, and then the dielectric layer may be patterned to expose the conductive patterns 353, thereby forming a dielectric pattern 351. The formation of the dielectric pattern 351 and the formation of the conductive patterns 353 may be repeatedly performed to form a redistribution layer 350. Uppermost conductive patterns 353 exposed on a top surface of the redistribution layer 350 may be upper pads 352 of the redistribution layer 350. Afterwards, a protective layer 355 may be formed on the dielectric pattern 351, having openings OP that expose the upper pads 352. For example, a protective material layer may be formed on the dielectric pattern 351, and then the protective material layer may be patterned to expose the upper pads 352, thereby forming the protective layer 355.

A bump structure 358 may be formed on the redistribution layer 350. For example, a metal layer may be formed on the upper pads 352, and then a solder ball may be formed on the metal layer.

A mask pattern may be formed on the redistribution layer 350 to partially expose top surfaces of the upper pads 352, and then a pattern of the mask pattern may be filled with a metallic material to form the metal layer. The formation of the metal layer may include performing a plating process. When measured from the top surfaces of the upper pad 352, a first width of the metal layer may be less than a second width of the opening OP. For example, the first width of the metal layer may be about 0.85 times to about 0.95 times the second width of the opening OP. For more detail, the first width of the metal layer may be about $^{25}/_{29}$ times to about $^{11}/_{12}$ times the second width of the opening OP. A value of about 6.5 μm or higher may be given to a difference between the first width of the metal layer and the second width of the opening OP. A value of about 3.5 μm or higher may be given to a gap between the metal layer and the protective layer, or an interval between the metal layer and an inner sidewall of the opening OP.

The solder ball may be formed on the metal layer. The solder ball may be formed by using a direct-current plating process. According to some embodiments, the plating process for forming the metal layer and the plating process for forming the solder ball may be performed in-situ. The present inventive concepts, however, are not limited thereto. For example, the solder ball may include one or more of tin (Sn), silver (Ag), copper (Cu), zinc (Zn), lead (Pb), and any alloy thereof.

Figure 23:
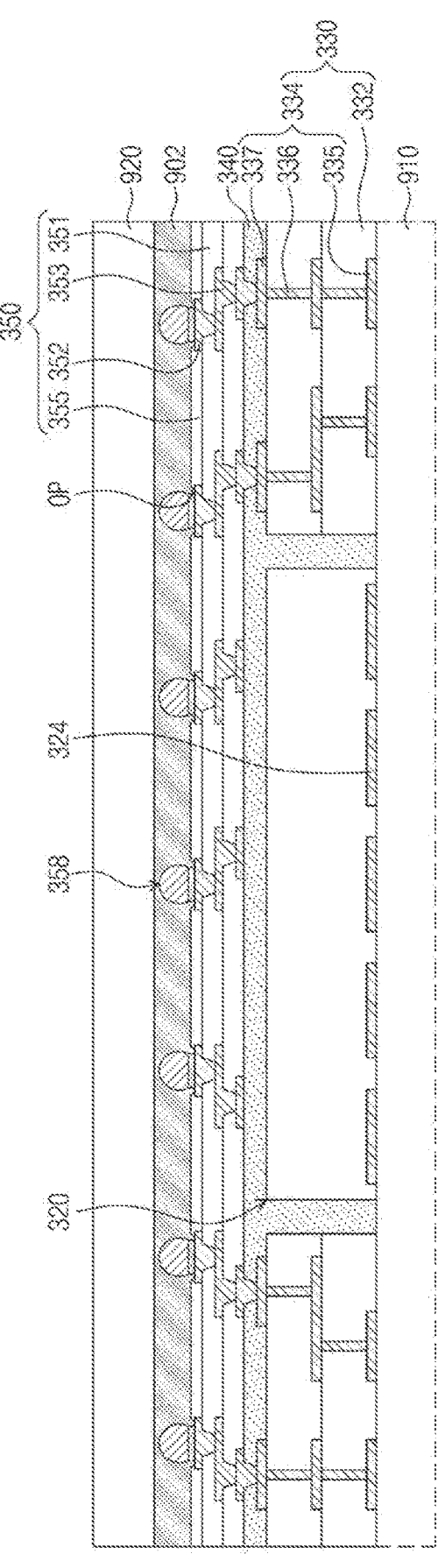

Referring to FIG. 23, a second carrier substrate 920 may be attached to the redistribution layer 350. For example, an adhesive layer 902 may be used to attach the second carrier substrate 920. The second carrier substrate 920 may be a dielectric substrate including glass or polymer, or may be a conductive substrate including metal. On the redistribution layer 350, the adhesive layer 902 may cover the protective layer 355 and bury the bump structure 358. A portion of the adhesive layer 902 may be introduced into a space between the bump structure 358 and the protective layer 355.

The first carrier substrate 910 may be removed. In a case where the first carrier substrate 910 is attached through an adhesive member to the package substrate 310, the adhesive member may be removed concurrently when the first carrier substrate 910 is removed. Therefore, a bottom surface of the semiconductor chip 320 may be exposed, and a bottom surface of the connection substrate 330 may be exposed.

Figure 24:
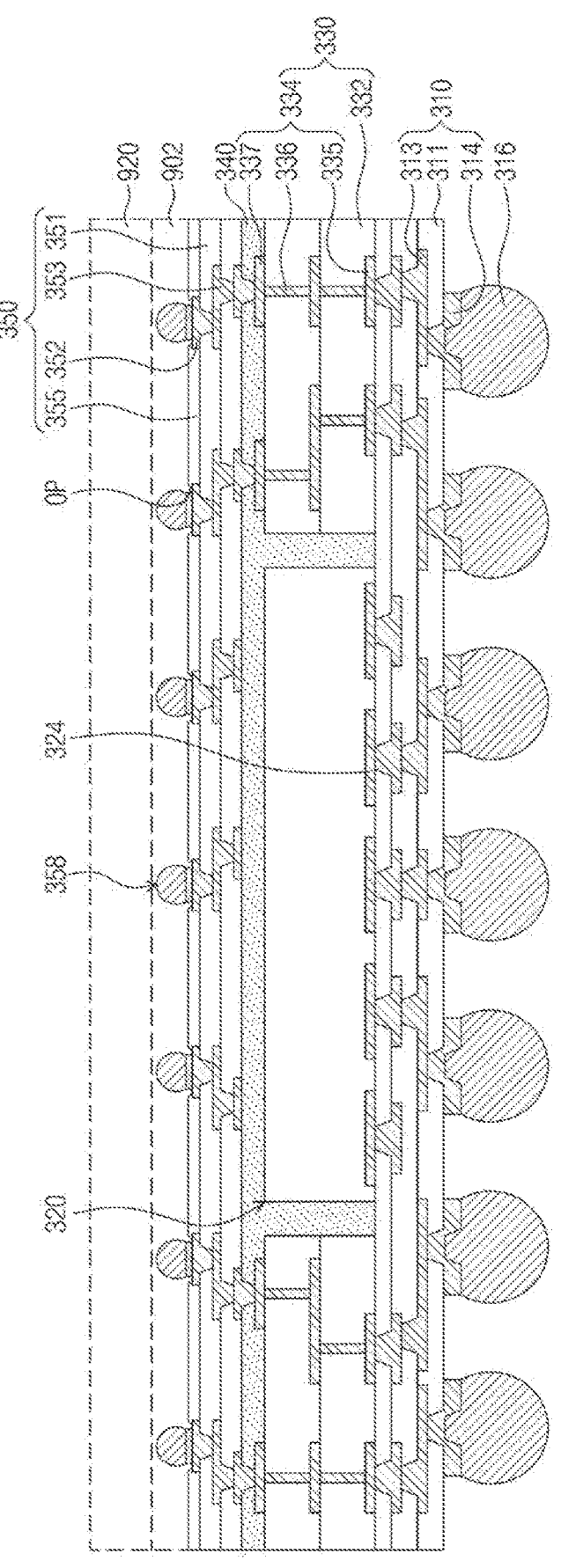

Referring to FIG. 24, a package substrate 310 may be formed below the semiconductor chip 320 and the connection substrate 330. For example, a dielectric layer may be formed on a bottom surface of the semiconductor chip 320 and a bottom surface of the connection substrate 330, and then the dielectric layer may be patterned to expose the lower pads 335 of the connection substrate 330 and the chip pads 324 of the semiconductor chip 320, thereby forming a dielectric pattern 311. A conductive layer may be formed on the dielectric pattern 311, and then the conductive layer may be patterned to form a conductive pattern 313. The formation of the dielectric pattern 311 and the formation of the conductive pattern 313 may be repeatedly performed to form the package substrate 310.

Thereafter, external pads 314 may be formed on a bottom surface of the package substrate 310, thereby being connected to the conductive pattern 313. For example, a lowermost dielectric pattern 311 may be patterned to expose the conductive pattern 313, a conductive layer may be formed on the lowermost dielectric pattern 311, and then the conductive layer may be patterned to form the external pads 314.

External pads 316 may be provided on the external pads 314.

Thereafter, the second carrier substrate 920 may be removed from the redistribution layer 350. When the second carrier substrate 920 is removed, the adhesive layer 902 may also be removed. This step may also remove the portion of the adhesive layer 902 introduced into the space between the bump structure 358 and the protective layer 355. According to some embodiments of the present inventive concepts, the first width of the metal layer of the bump structure 358 may be less than about 0.95 times the second width of the opening OP, and thus the portion of the adhesive layer 902 may be easily removed from the space between the bump structure 358 and the protective layer 355. For example, to easily remove the portion of the adhesive layer 902, a value of about 6.5 μm or higher may be given to a difference between the first width of the metal layer of the bump structure 358 and the second width of the opening OP, and as value of about 3.5 μm or higher may be given to an interval between the metal layer of the bump structure 358 and an inner sidewall of the opening OP.

The embodiment of FIGS. 21 to 24 explains that the redistribution layer 350 is formed on the semiconductor chip 320 and the connection substrate 330, and then the package substrate 310 is formed, but the present inventive concepts are not limited thereto. According to other embodiments, the package substrate 310 may be formed on the first carrier substrate 910, the connection substrate 330 and the semiconductor chip 320 may be mounted on the package substrate 310, the molding layer 340 may be formed on the package substrate 310, the redistribution layer 350 and the bump structure 358 may be formed on the molding layer 340, the adhesive layer 902 may be used to attach the second carrier substrate 920 to the redistribution layer 350, the first carrier substrate 910 may be removed, the external terminals 316 may be formed below the package substrate 310, and the second carrier substrate 920 may be removed. Alternatively, if necessary, a semiconductor package may be fabricated by various methods.

According to some embodiments of the present inventive concepts, it may be possible to provide a semiconductor device in which a metal layer and a protective layer are not provided therebetween with a residual adhesive layer that can occur during a semiconductor fabrication process, while preventing a degradation of electrically properties of the semiconductor device and an increase in area of the semiconductor device. Thus, there may be provided a semiconductor device with less contamination and increased structural stability.

In addition, a gap between the metal layer and the protective layer may have a width that decreases in a direction toward a floor of the gap. For example, the gap may have a shape whose entrance is wide and whose floor is narrow. Therefore, in a subsequent process during semiconductor fabrication, it may be possible to easily remove an adhesive layer introduced between the metal layer and the protective layer. Thus, there may be provided a semiconductor device with less contamination and increased structural stability.

Although the present inventive concepts have been described in connection with the embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor device, comprising:
a pad on a semiconductor chip;
a protective layer on the semiconductor chip and covering the pad, the protective layer having an opening that exposes a portion of a top surface of the pad; and
a bump structure electrically connected to the pad,
wherein the bump structure includes:
a metal layer on and contacting the pad; and
a solder ball on the metal layer,
wherein a planar bottom surface of the metal layer that is in contact with the pad has a first width,
wherein the opening has a second width that is a width of the portion of the top surface of the pad exposed by the opening, and
wherein the first width of the planar bottom surface of the metal layer is about 0.85 times to about 0.95 times the second width of the opening.

2. The device of claim 1, wherein the first width is about 25/29 times to about 11/12 times the second width.

3. The device of claim 1,
wherein a third width of the solder ball is greater than the first width of the metal layer, and
wherein an interface between the metal layer and the solder ball is at a level higher than a level of a top surface of the protective layer.

4. The device of claim 1, wherein a difference between the second width and the first width is equal to or greater than about 6.5 μm.

5. The device of claim 1, wherein an interval between the metal layer and an inner sidewall of the opening is equal to or greater than about 3.5 μm.

6. The device of claim 1,
wherein a planar shape of the metal layer is the same as a planar shape of the opening, and
wherein each of the planar shape of the metal layer and the planar shape of the opening has a circular planar shape or a rectangular planar shape.

7. The device of claim 1,
wherein an inner sidewall of the opening has a first inclination surface inclined to the top surface of the pad, and
wherein the first inclination surface becomes distant from the metal layer in a direction away from the top surface of the pad.

8. The device of claim 7, wherein an outer sidewall of the metal layer has a second inclination surface inclined to the top surface of the pad.

9. The device of claim 1, further comprising a through electrode that vertically penetrates the semiconductor chip and is coupled to the pad.

10. A semiconductor device, comprising:
a substrate;
a semiconductor chip on the substrate;
a molding layer on the substrate and surrounding the semiconductor chip; and
a redistribution layer on the molding layer and the semiconductor chip;
wherein the redistribution layer includes:
a dielectric pattern;
a conductive pattern on the dielectric pattern;
a pad on the dielectric pattern and connected to the conductive pattern;
a bump structure having a planar bottom surface in contact with an upper surface of the pad; and
a protective layer on the dielectric pattern and surrounding the bump structure,
wherein the bump structure is in an opening formed in the protective layer to expose the pad,
wherein the planar bottom surface of the bump structure that is in contact with the pad has a first width,
wherein the opening has a second width that is a width of a portion of the pad exposed by the opening, and
wherein the first width of the planar bottom surface of the bump structure is about 0.85 times to about 0.95 times the second width of the opening.

11. The device of claim 10,
wherein the bump structure includes:
a metal layer on the pad; and
a solder ball on the metal layer, and
wherein the first width is a width of the metal layer.

12. The device of claim 11,
wherein a third width of the solder ball is greater than the width of the metal layer, and
wherein an interface between the metal layer and the solder ball is at a level higher than a level of a top surface of the protective layer.

13. The device of claim 10, wherein the first width is about 25/29 times to about 11/12 times the second width.

14. The device of claim 10, wherein a difference between the second width and the first width is equal to or greater than about 6.5 μm.

15. The device of claim 10, wherein an interval between the bump structure and an inner sidewall of the opening is equal to or greater than about 3.5 μm.

16. The device of claim 10, further comprising a through electrode that vertically penetrates the molding layer on one side of the semiconductor chip and connects the substrate to the redistribution layer.

17. The device of claim 10, further comprising:

a connection substrate on the substrate and connecting the substrate to the redistribution layer, wherein the connection substrate has a mounting region that vertically penetrates the connection substrate, wherein the semiconductor chip is in the mounting region, and wherein the molding layer fills a space between the connection substrate and the semiconductor chip.

18. A method of fabricating a semiconductor device, the method comprising:

forming a molding layer that covers a semiconductor chip;

forming a redistribution layer on the molding layer, wherein the redistribution layer includes:

a dielectric pattern, a conductive pattern on the dielectric pattern, a pad on the dielectric pattern and connected to the conductive pattern, and a protective layer having an opening that covers the pad and exposes a portion of the pad;

providing a bump structure on the pad;

attaching a carrier substrate to the redistribution layer using an adhesive layer; and removing the carrier substrate, wherein a first width of the bump structure is about 25/29 times to about 11/12 times a second width of the opening, wherein, after the carrier substrate is removed, the adhesive layer does not remain in a space between the bump structure and an inner sidewall of the opening, wherein when the carrier substrate is attached, a portion of the adhesive layer is introduced into the space, and wherein when the carrier substrate is removed, the portion of the adhesive layer is completely removed from the space.

19. The method of claim 18, wherein the bump structure includes:

a metal layer on the pad; and a solder ball on the metal layer, and wherein the first width is a width of the metal layer.

* * * * *